US010440849B2

(12) United States Patent
Leigh et al.

(10) Patent No.: US 10,440,849 B2
(45) Date of Patent: Oct. 8, 2019

(54) FIRST SOCKET NESTED IN A SECOND SOCKET

(71) Applicant: Hewlett Packard Enterprise Development LP, Houston, TX (US)

(72) Inventors: Kevin B. Leigh, Houston, TX (US); George D. Megason, Spring, TX (US); John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/737,587

(22) PCT Filed: Jun. 19, 2015

(86) PCT No.: PCT/US2015/036665
§ 371 (c)(1),
(2) Date: Dec. 18, 2017

(87) PCT Pub. No.: WO2016/204783
PCT Pub. Date: Dec. 22, 2016

(65) Prior Publication Data
US 2018/0177065 A1    Jun. 21, 2018

(51) Int. Cl.
*H05K 7/10* (2006.01)
*G06K 7/10* (2006.01)
(Continued)

(52) U.S. Cl.
CPC ............ *H05K 7/1092* (2013.01); *G06F 1/20* (2013.01); *G06K 7/10297* (2013.01); *G06K 19/0723* (2013.01); *G06K 19/07773* (2013.01); *H01R 12/7076* (2013.01); *H05K 1/18* (2013.01); *H05K 3/301* (2013.01); *H04B 10/40* (2013.01); *H05K 2201/10098* (2013.01); *H05K 2201/10121* (2013.01); *H05K 2201/10325* (2013.01)

(58) Field of Classification Search
CPC ........ H05K 7/1092; H05K 3/301; H05K 1/18; H05K 2201/10121; H05K 2201/10325; H05K 2201/10098; G06K 19/0723; G06K 7/10297; G06K 19/07773; H01R 12/7076; H04B 10/40; G06F 1/20
See application file for complete search history.

(56) References Cited

U.S. PATENT DOCUMENTS 5,074,799 A    12/1991  Rowlette
5,454,160 A    10/1995  Nickel
(Continued)

OTHER PUBLICATIONS

"Sensor-enabled RFID Tags Extend Wireless Data-logging Beyond Identification," Aug. 27, 2013, 5 pps., http://www.ecnmag.com/product-releases/2013/08/sensor-enabled-rfid-tags-extend-wireless-data-logging-beyond-identification.
(Continued)

*Primary Examiner* — Sonji N Johnson
(74) *Attorney, Agent, or Firm* — Hewlett Packard Enterprise Patent Department

(57) ABSTRACT

Examples herein disclose an apparatus. The apparatus includes a first socket nested in a second socket. The first socket includes a cavity, disposed in the first socket, to accept a chipset. The first socket includes an electrical contact, disposed in the cavity, to couple the chipset to a board. The chipset detects when a modular infrastructure is coupled to the second socket.

14 Claims, 8 Drawing Sheets

(51) Int. Cl.
  *G06K 19/07* (2006.01)
  *G06K 19/077* (2006.01)
  *H01R 12/70* (2011.01)
  *H05K 1/18* (2006.01)
  *H05K 3/30* (2006.01)
  *G06F 1/20* (2006.01)
  *H04B 10/40* (2013.01)

(56) References Cited

U.S. PATENT DOCUMENTS

| | | | |
|---|---|---|---|
| 5,481,436 A * | 1/1996 | Werther | H05K 1/141 174/260 |
| 7,348,887 B1 | 3/2008 | Warner | |
| 7,775,442 B2 | 8/2010 | Saarisalo | |
| 8,421,626 B2 | 4/2013 | Downie | |
| 8,461,725 B1 | 6/2013 | Stubbs | |
| 8,779,578 B2 | 7/2014 | Leigh | |
| 8,909,051 B2 | 12/2014 | Zulfiqar | |
| 8,924,609 B2 | 12/2014 | Fowler | |
| 8,964,384 B2 | 2/2015 | Leigh | |
| 9,232,681 B2 * | 1/2016 | Leigh | H05K 7/10 |
| 2011/0014802 A1 | 1/2011 | Demuynck | |
| 2014/0002979 A1 * | 1/2014 | Leigh | H05K 7/10 361/679.31 |
| 2014/0073300 A1 | 3/2014 | Leeder | |

OTHER PUBLICATIONS

"Sparkfun RFID Starter Kit Hookup Guide," Retrieved from Internet Jun. 8, 2015, 15 pps., <https://learn.sparkfun.com/tutorials/sparkfun-rfid-starter-kit-hookup-guide.

* cited by examiner

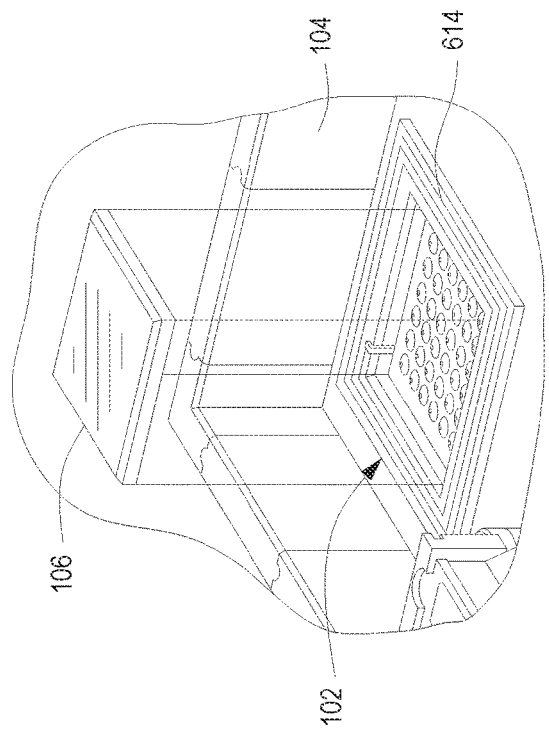
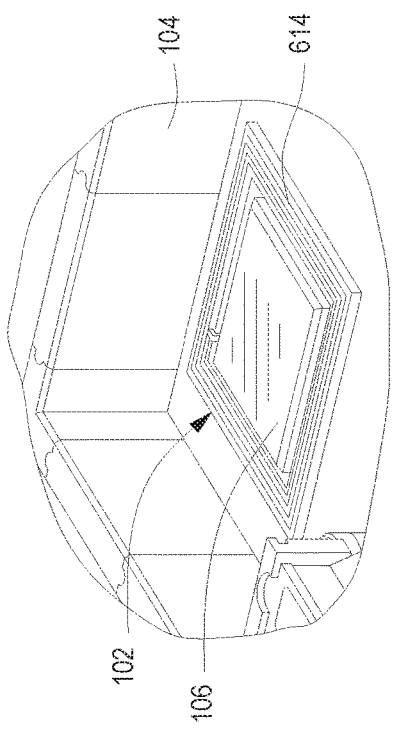
FIG. 6A
FIG. 6B
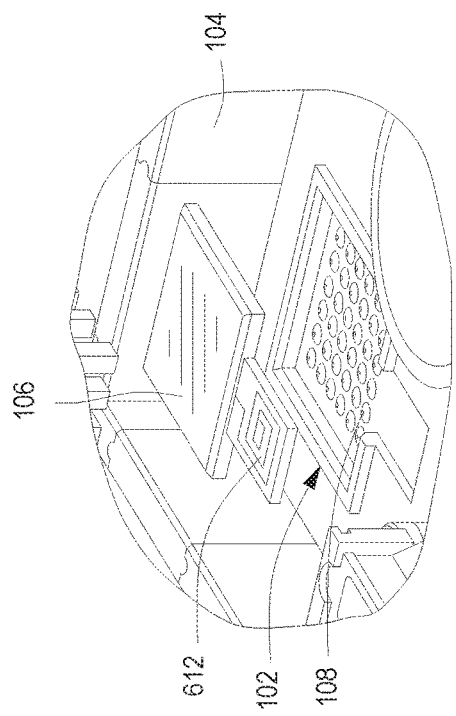
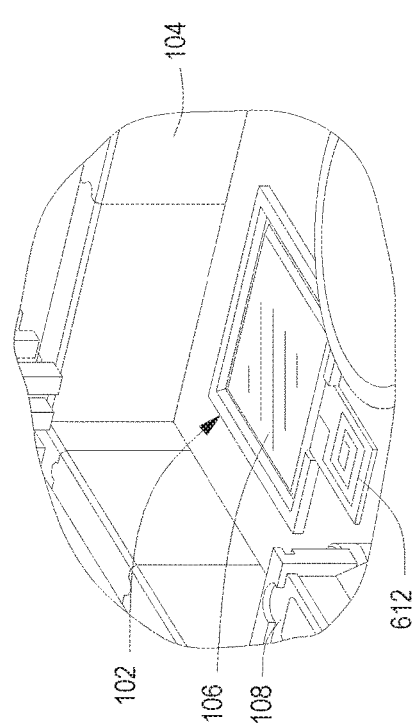
FIG. 6C
FIG. 6D

FIRST SOCKET NESTED IN A SECOND SOCKET

BACKGROUND

Computing components may be packaged and coupled directly to a printed circuit board (PCB) via a socket or other component. Sockets are mechanisms which secure the computing components to the PCB. The computing components may differ in type, properties, and characteristics.

BRIEF DESCRIPTION OF THE DRAWINGS

In the accompanying drawings, like numerals refer to like components or blocks. The following detailed description references the drawings, wherein:

FIGS. 6A-6D illustrate perspective views of an example antenna in accordance with the present disclosure.

DETAILED DESCRIPTION

Computing components such as connectors may be coupled to a PCB through a socket. These connectors may not be compatible with, or optimal for, coupling with other computing components, due to the varying characteristics and properties of such components. For example, a connector may not be compatible with different types of optical transceivers due to the variance in voltage ratings for electrical connectors or signal wavelengths for optical connectors. Compatibility as described herein, is a state in which the connector as coupled to the computing component is able to operate in a system without sub-optimal functioning.

Various methods and devices may be employed to facilitate the compatibility between the connector and other components. To test compatibility, a system may be powered on to verify this compatibility; however, this may cause sub-optimal functionality and worse, damage. In another example, manual verification may ensure proper coupling between the connector and optical transceiver, but this may be tedious and error-prone.

To address these issues, examples disclose a mechanism to automate the detection of coupling a connector (disposed in a socket) to another computing component. The examples disclose an apparatus including a first socket nested in a second socket. A cavity is disposed in the first socket in such a manner that it receives a chipset. The cavity includes an electrical contact which couples the chipset to a board. The chipset detects when a modular infrastructure is coupled to the second socket. The modular infrastructure includes transceiver component(s) which couple to a connector within the second socket in such a manner that a physical and/or communicative connection is formed. Providing a mechanism in which to detect when the connector is coupled to the transceiver component on the modular infrastructure, automates the detection of the connector to the computing component.

In another example, the modular infrastructure is a part of a multi-chip module disposed with optical transceivers. The optical transceivers couple to the optical connectors (disposed in the second socket). In this example, the chipset includes an RFID reader while the optical transceivers are associated with an RFID tag. In this manner, the RFID tag(s) are used to verify the optical transceivers to the RFID reader. This in turn enables a controller to verify the compatibility between the optical connectors and the optical transceivers. Verifying the compatibility, enables a system to take proactive approach to prevent damage to the system if the components are deemed incompatible.

In a further example discussed herein, an antenna is either coupled to the chipset or coupled to the first socket. Placing the antenna in two different areas, provides a flexible feature to optimize component design and layout.

Figure 1:
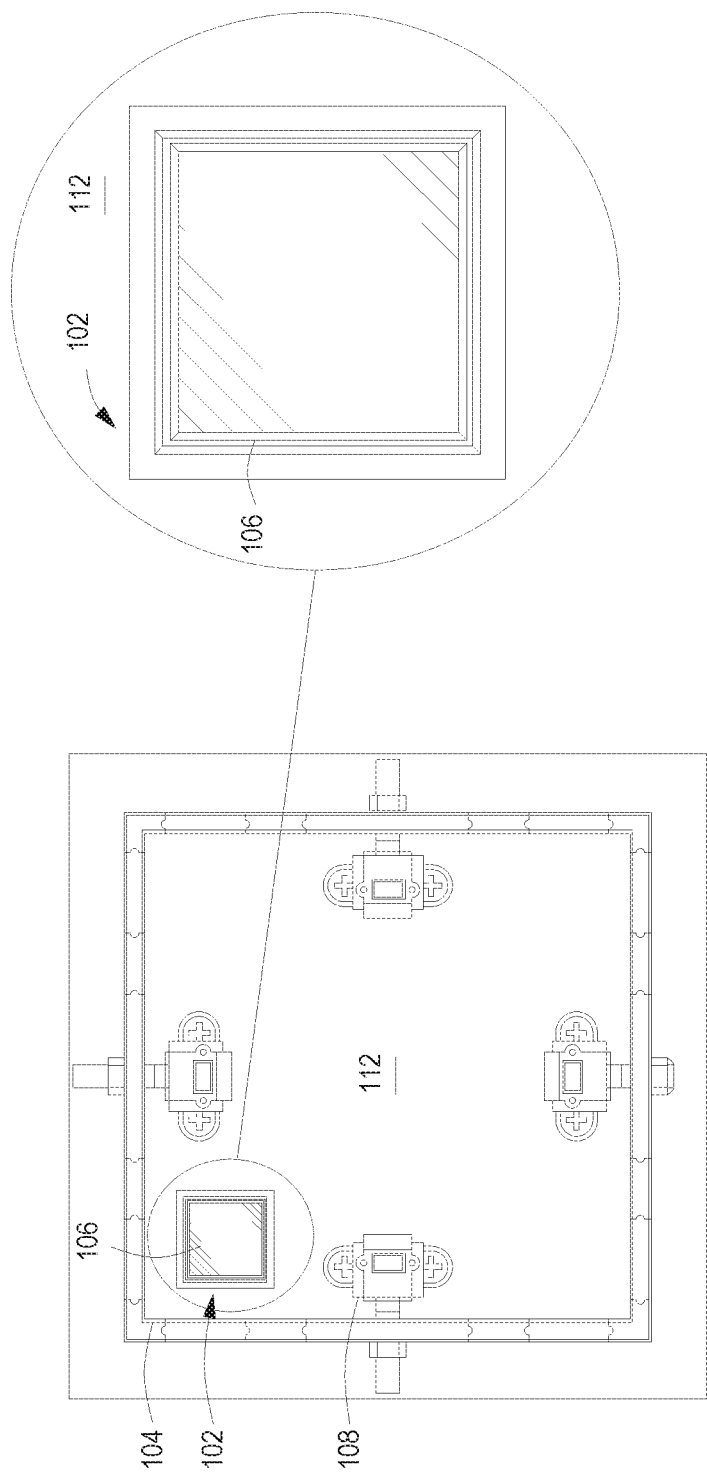
FIG. 1 illustrates a top view of an example apparatus in accordance with the present disclosure.

Referring now FIG. 1, a first socket 102 nested in a second socket 104 is illustrated in accordance with an example of the present disclosure. Nesting the first socket 102 includes embedding the first socket 102 in such a manner that the first socket 102 is recessed from the second socket 104. The first socket 102 includes a cavity as disposed under a chipset 106. The cavity (not illustrated), disposed in the first cavity 102, receives the chipset 106 and includes electrical contacts for coupling to the chipset 106 to provide functionality. The cavity includes a support surface and is coupled to multiple support walls to configure the first socket 102. In other implementations, electrical contacts are disposed within the cavity to couple to the chipset 106. The cavity as disposed within the first socket 102 will be readily apparent in later figures.

The second socket 104 includes a cavity 112 different from the cavity disposed within the first socket 102. The cavity 112 includes a support surface and is coupled to multiple support walls to configure the second socket 104. In one implementation, the cavity 112 disposed in the second socket 104 is elevated above the cavity disposed in the first socket 102.

The connectors 108 may be indirectly coupled to the base infrastructure (as described in later figures) via the second socket 104. In implementations, the connectors 108 may be modularly installed in the second socket 104 or affixed through secure mechanism to the second socket 104. The connectors 108 may be modularly installed by installing screws or other mechanical features to affix to the connectors 108 to the second socket 104. These connectors 108 enable the second socket 104 to couple to other transceiver components (e.g., optical transceivers). The second socket 104 is coupled to the PCB through soldering, adhering, or mechanically retaining the second socket 104 on the PCB. The coupling between the connectors 108 and other transceiver components may be readily apparent in later figures.

The chipset 106 is installed in the first socket 102 to detect the coupling of the connectors 108 to components affixed to a modular infrastructure. The modular infrastructure includes multiple transceiver components which are coupled to the connectors 108 in the second socket 104. The chipset 106, received by the cavity in the first socket 102, provides management control and functionality of an RFID reader. In one implementation, the chipset 106 comprises a near field communication (NFC) reader. In this implementation, the NFC reader detects when the transceiver components as part of the modular infrastructure are coupled to the second socket 104 via the connectors 108. The components as part of the modular infrastructure each include a corresponding RFID tag. When the modular infrastructure with the corresponding RFID tag is brought within proximity to the second socket 104, the NFC reader can verify and identify the modular infrastructure associated with the RFID tag. Implementations of the chipset 106 include a device to establish radio communication such as the NFC reader, radio frequency device, etc.

The connectors 108, coupled to the second socket 104, are devices which couple with computing components (e.g., optical transceivers) on the modular infrastructure. The connectors 108 couple with the computing components by joining together such that it forms a connection. Thus, upon the modular infrastructure being coupled to the connectors 108, the chipset 106 is able to detect when the modular infrastructure is coupled to the second socket 104. In one implementation, the connectors 108 include optical connectors which couple to a module of optical transceivers. This implementation is discussed in detail in later figures. Implementations of the connectors 108 include, by way of example, an optical connector, an electrical connector, radio frequency connector, or other type of device to create the joined connection.

Figure 2:
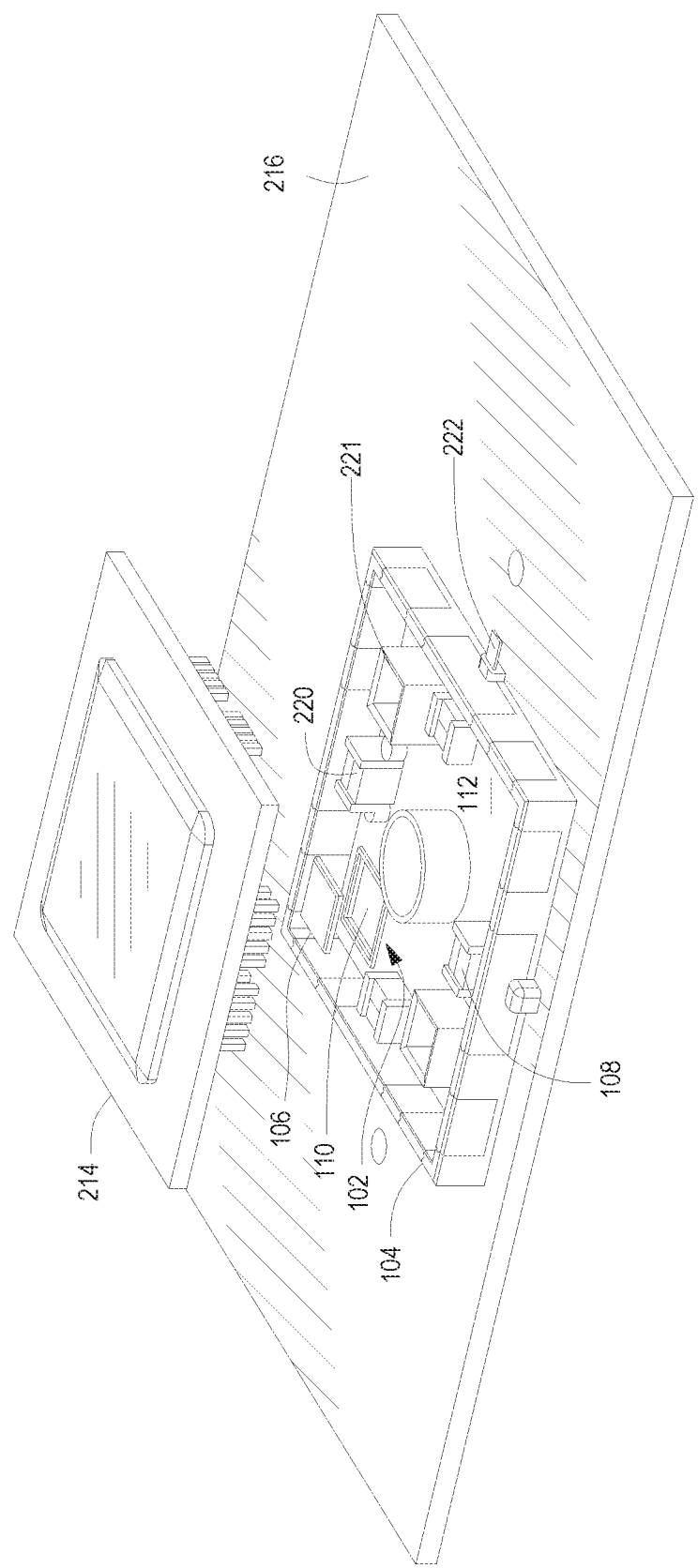
FIG. 2 illustrates an exploded view of an example system including a first socket and a second socket in accordance with the present disclosure.

FIG. 2 illustrates an exploded view of an example system including a base infrastructure with a board 216 affixed with connectors 108. The connectors 108 couple to the second socket 104 through hollow cavities located on the second socket 104. The second socket 104 includes a cavity 112 and a nested first socket 102. The first socket 102 is considered nested within the second socket 104, as the socket 102 may be recessed from the cavity 112. The first socket 102 includes a cavity 110 (different from cavity 112) in which to receive a chipset 106. The chipset 106 operates using radio frequency identification technology to detect when a modular infrastructure as part of a multi-chip module 214 is coupled to the connectors 108 within the second socket 104. In another implementation, the cavity 110 is elevated below or recessed from the cavity 112.

The base infrastructure includes the board 216, optical connectors 108, pigtail fibers 222 optically coupling to optical configurations, such as optical waveguides, fibers, cables, etc. The base infrastructure is intended to provide functionality to the system. As used herein, the based infrastructure includes the board 216, optical waveguides, an integrated circuit, printed circuit assembly (PCA), a printed circuit board (PCB), and/or any other type of circuit board with may include various computing components. Additionally, the base infrastructure and in turn the board 216 may further include optical cables, electrical cables, integrated circuits, and/or other computing components.

The multi-chip module 214 includes a modular infrastructure (located on the bottom side) to support the transceiver components, such as the optical transceivers. In one implementation, the multi-chip module 214 includes a processor on one side of the module while the opposite side includes the multiple optical transceivers. In another implementation, the multi-chip module 214 includes a switch chip on one side of the module while the opposite side includes multiple optical transceivers. This implementation is described in detail in later figures.

As discussed previously, the chipset 106 as installed in the first socket 102 detects when one of the computing components supported by the multi-chip module 214 is coupled to the connectors 108 within the second socket 104. In one example, the chipset 106 detects the coupling through the RFID technology. In this implementation, chipset 106 operates as a RFID reader while the multi-chip module 214 includes a RFID tag on the underside. Upon the multi-chip module 214 being coupled to the connectors 108 within the second socket 104, the chipset 106 communicates with the RFID tag to identify the type of modular infrastructure coupling with the second socket 104. This implementation allows a controller to determine whether the modular infrastructure coupling with the second socket 104 may be compatible. In another implementation, the connectors 108 include RFID tags to further allow the controller to identify the characteristics of the connectors 108 and modular infrastructure (e.g., optical transceivers) for verifying compatibility. These implementations are explained in detail in later figures.

Figure 3:
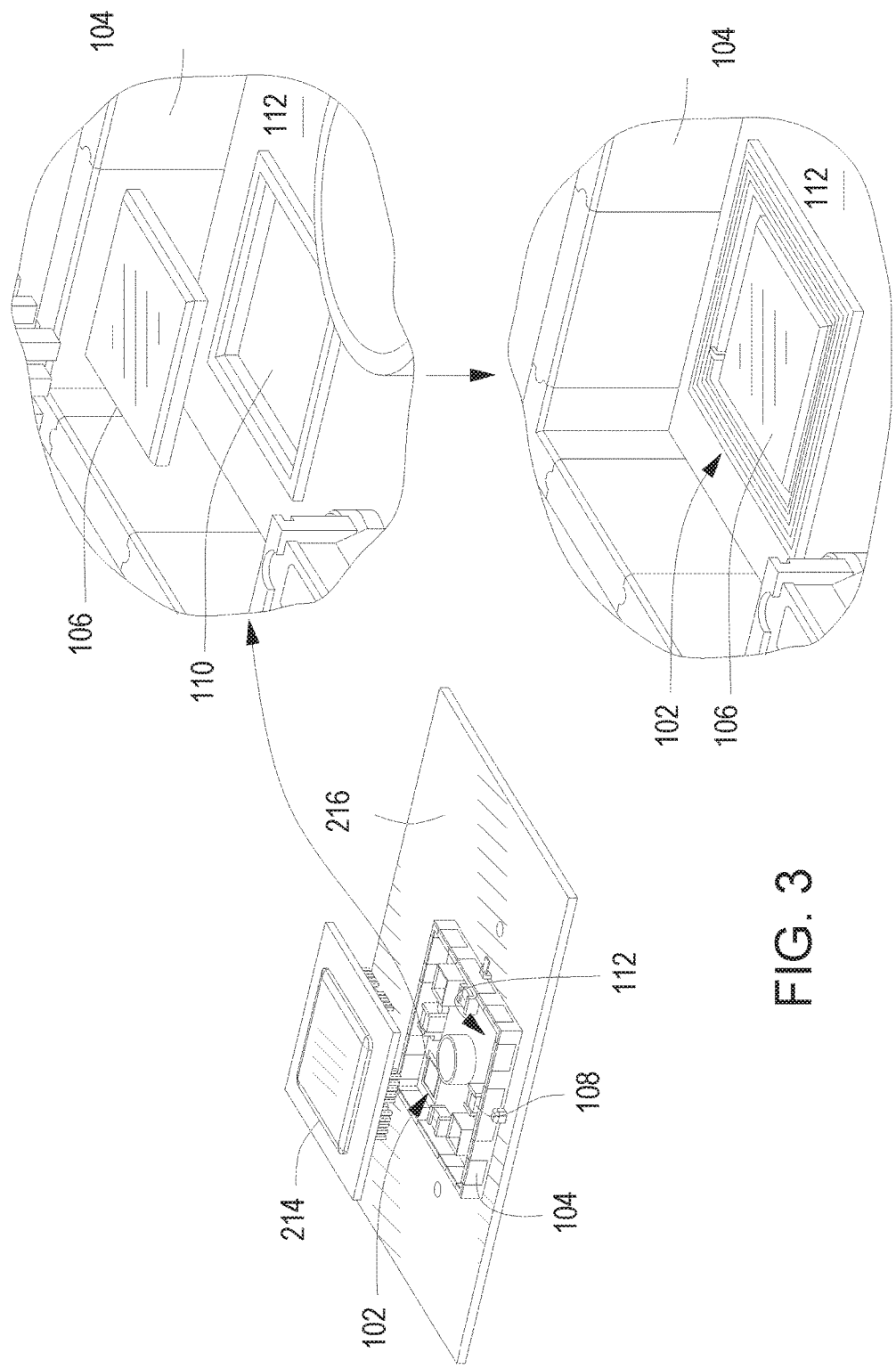
FIG. 3 illustrates an additional exploded view of an example system including a first socket and a second socket in accordance with the present disclosure.

FIG. 3 illustrates an additional exploded view of an example system in accordance with the present disclosure. The system includes a base infrastructure as a board 216 which includes the first socket 102 embedded in a second socket 104. The first socket 102 includes a cavity 110 to receive a chipset 106. FIG. 3 depicts the chipset 106 prior to installation (as in the top right) and upon installation (as in the bottom right). The second socket 104 includes a different cavity 112 in the sense that cavity 112 is considered elevated higher than the cavity 110 disposed in the first socket. In other words, the cavity 110 within the first socket 102 includes a support surface located below the support surface of the cavity 112.

The second socket 104 further supports multiple optical connectors 108. As explained in connection with earlier figures, the multiple connectors 108 may be disposed within the second socket 104. These optical connectors 108 couple to the optical transceivers and corresponding heat sinks on the underside of the multi-chip module 214. Upon the connectors 108 coupling to the optical transceivers, the chipset 106 operates as a RFID reader to receive identifying information from RFID tags associated with each of these optical transceivers. This example may be explained in detail in the next figure.

Figure 4:
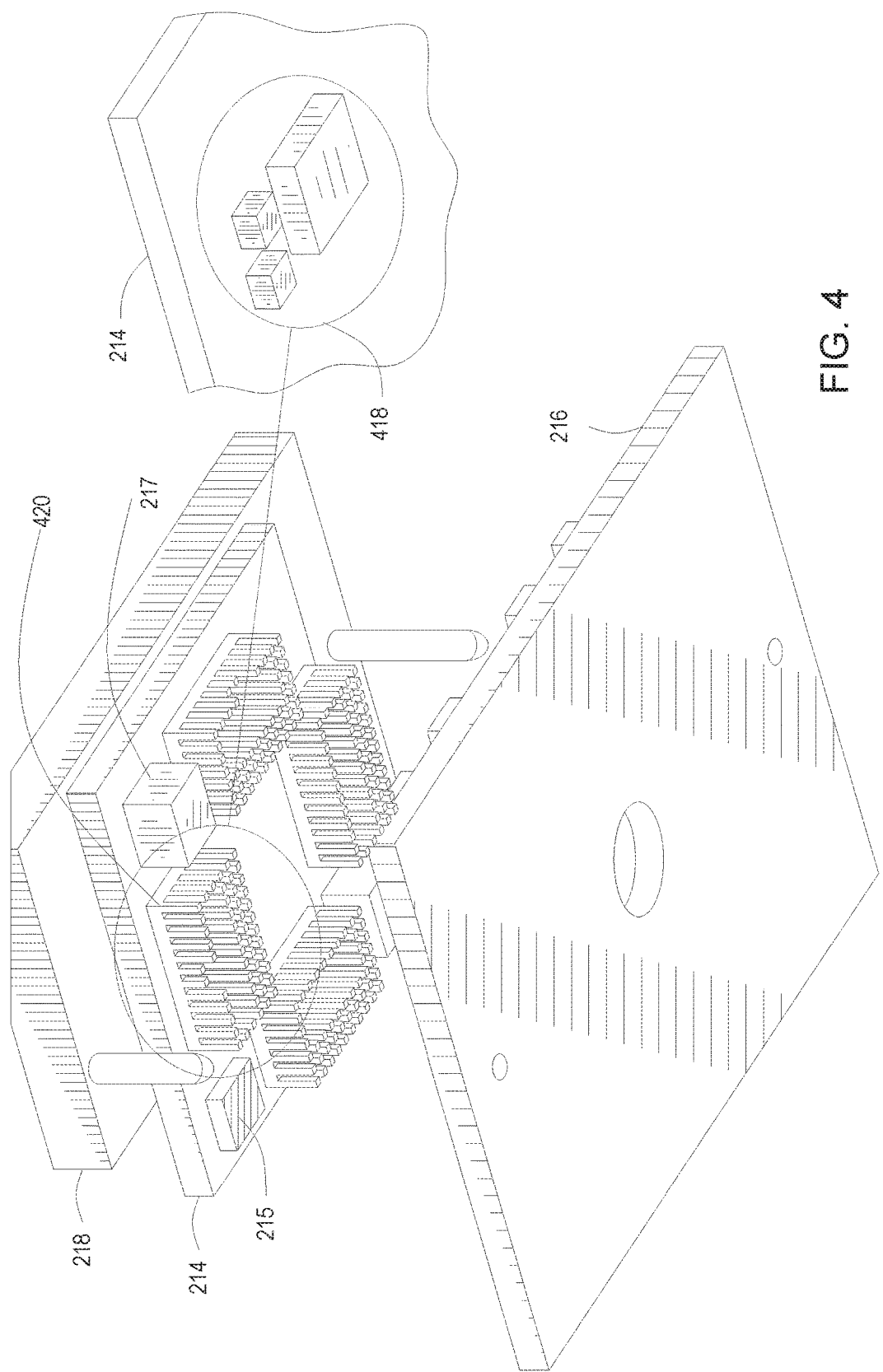
FIG. 4 illustrates a perspective view of an example system in accordance with the present disclosure.

FIG. 4 illustrates a bottom view of an example system in accordance with the present disclosure. The view of the example system illustrates the underside of the board 216. As explained in relation to prior figures, the board 216 accommodates the first and second sockets (not illustrated) and corresponding socket extensions. Thus, since the underside of the board 216 as illustrated in FIG. 4, the sockets and connectors may not be pictured.

The heat sink 218, located above the multi-chip module 214, couples with a processor on the top side of the module for cooling purposes. For example, the heat sink 218 may couple with the processor for cooling by dissipating the heat produced by the processor.

The multi-chip module 214, as viewed from the bottom, comprises a modular infrastructure. The modular infrastructure includes multiple optical transceivers 418, corresponding heat sinks of the optical transceivers 420, an electrical connector 217, and a RFID tag 215. These optical transceivers 418 are located on the modular infrastructure (underside of the multi-chip module) to couple with the optical connectors disposed within a second socket on the board 216. The corresponding heat sinks 420 are used to dissipate heat from the optical transceivers 418. Each heat sink 420 may surround an optical receptacle (not shown) for a corresponding optical transceiver 418. An optical receptacle will blindmate with optical connector 108 in the second socket 104. The electrical connector 217 couples to corresponding electrical connectors within the second socket. The electrical connector 217 provides power to the optical transceivers 418.

In implementations, the optical connectors supported by the second socket 104 may not be compatible with or optimal with a type of the optical transceivers 418 on the multi-chip module 214. As such, when the chipset (installed in the first socket) detects the coupling of the optical transceivers 418 to the corresponding optical connectors on the board 216 via the RFID tag 215. Upon detecting the coupling of these components, the chipset may transmit a signal to a controller for verification. As such, the coupling of the optical transceivers 418 to the optical connectors within the second socket 104 is detected by communication between the RFID tag 215 located on the underside of the multi-chip module 214 and the chipset (not illustrated). The controller may then verify whether the corresponding optical connectors 108 in the second socket 104 are compatible with the various optical transceivers 418. In further implementations, each optical transceiver 418 includes a different RFID tag to identify itself to the chipset 106. In this implementation, each of the multiple optical transceivers 418 consist of different characteristics. Thus, each of the optical transceivers 418 may be compatible with a specific optical connector 108 within the second socket 104. This allows the chipset to track those optical transceivers 418 which have varying characteristics and the specific corresponding optical connectors to determine whether the coupling is compatible. Additionally, in these implementations, the chipset 106 is implemented in such a manner as to detect when the optical transceivers 418 are installed with the proper optical connectors in the second socket.

Figure 5:
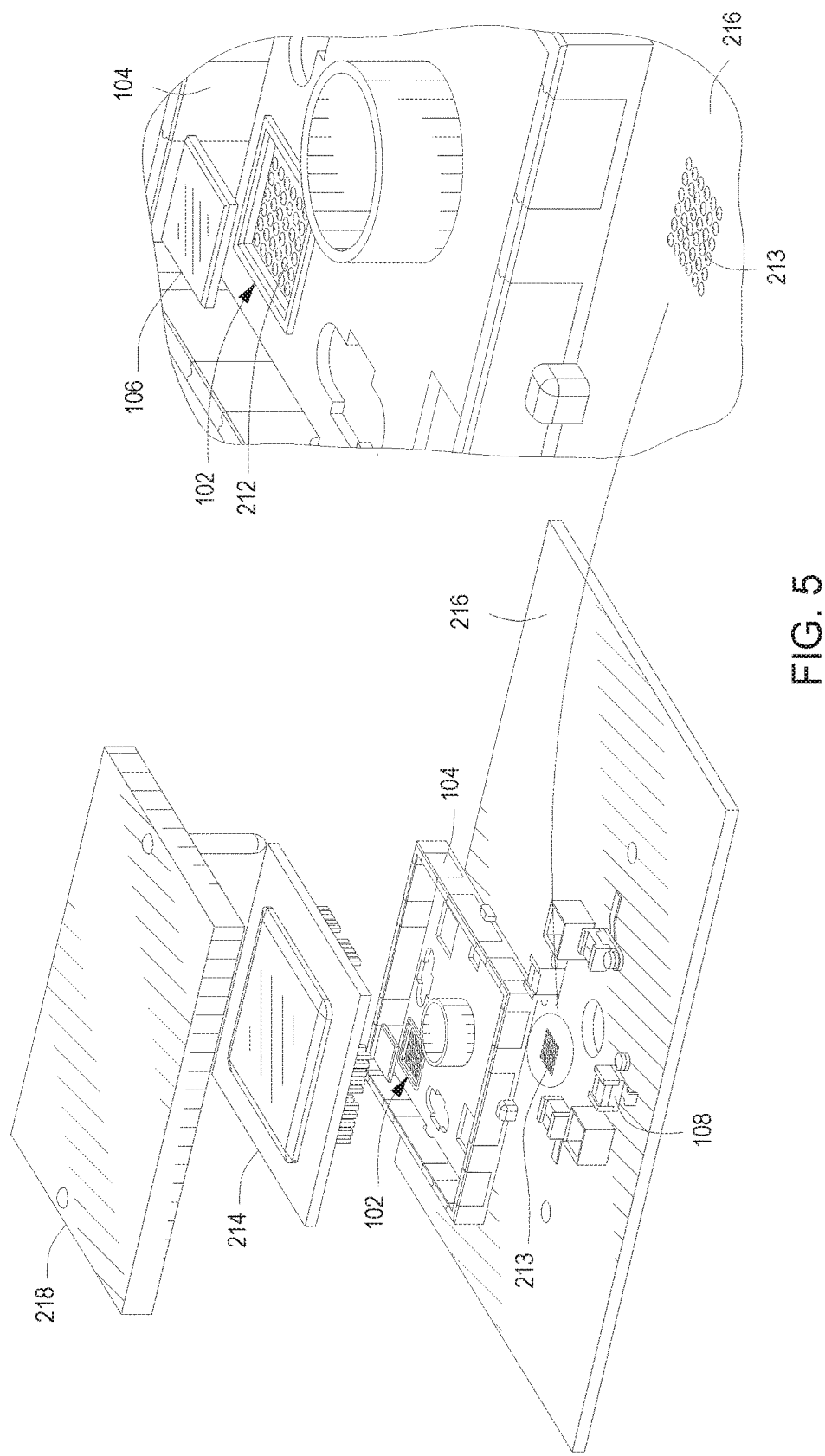
FIG. 5 illustrates an exploded view of an example system in accordance with the present disclosure.

Referring to FIG. 5, an exploded view of a system is illustrated in accordance with an example of the present disclosure. The system includes a heat sink 218 as positioned above a multi-chip module 214. The multi-chip module 214 includes a computing component coupled on a top side of the module, while the underside includes a modular infrastructure. The modular infrastructure includes multiple transceiver components, electrical connectors, and/or an RFID tag. The multiple optical transceivers on the underside of the module 214, couple to the second socket 104 via optical connectors 108. These optical connectors 108 couple to the base infrastructure via the second socket 104.

Electrical contacts 212, disposed within the cavity 110, are used to receive the chipset 106 for coupling to the first socket 102. The top view of the electrical contacts 212 in the cavity 110 electrically couple to corresponding electrical contacts 213 on the board 216. Electrical contacts 213, disposed on the board 216, are used to couple the first socket 102 to the board 216. The cavity 110 utilizes electrical contacts 212 to couple to the board 216. These electrical contacts 213 are included as part of the board 216 to provide electrical signals to the rest of the system. As such, the electrical contacts 212 and 213 may be disposed by adhesive means such as soldering. As such in this implementation, upon installing the chipset 106 within the first socket 102, the installation provides the electrical connections to receive and transmit the electrical signals.

Referring now to FIGS. 6A-6D, illustrate various perspective views of coupling an antenna 612 and 614 prior and upon installation of a chipset 106. The antennas 612 and 614 represent how the antenna traces are coupled to features of the present disclosure. For example, FIGS. 6A-6B illustrate an example antenna 612 as coupled to a chipset 110 while FIGS. 6C-6D illustrate an example antenna 614 as coupled to the first socket 102.

FIG. 6A represents the first socket 102 prior to installation of the chipset 106. In this implementation, the chipset 106 is coupled to the antenna 612 prior to installation. The chipset 106 is installed in the first socket 102 by placing the chipset 106 into a cavity 110. The cavity 110 includes an additional notch in which the antenna 612 is placed upon installation of the chipset 106. In this figure, the antenna 612 is located on a protruding substrate with electrical contacts coupled to the chipset 106. Coupling the antenna 612 to the chipset 106 includes connecting, forming a pair, and/or bringing together the antenna 612 and the chipset 106 in such a manner that the components become physically and/or communicatively connected.

The antenna 612 is an electrical device which converts electrical current from the chipset 106 into electro-magnetic waves at specific radio frequencies and vice versa. In accordance with the present disclosure, the antenna 612 is used in connection with the chipset 106 to emit electromagnetic waves at a particular frequency to a RFID tag associated with an optical transceiver. The tag in turn generates and emits the electromagnetic waves back to the antenna 612 at the particular frequency. Generating the electromagnetic waves at the particular frequency back to the chipset 106, provides a basic verification mechanism of the transceiver to the connector 108. The antenna 612 allows the chipset 106 to detect when the optical transceiver is coupled to a connector within the second socket 104.

FIG. 6B represents the first socket 102 after installation of the chipset 106. In this implementation, the chipset 106 is installed in the cavity 110. As such, the cavity 110 as observed in FIG. 6A is located below the installed chipset 106. The antenna 612 which is coupled to the chipset 106 is installed in the notch portion of the first socket 102. The notch portion receives the antenna 612 as part of the cavity 110.

FIG. 6C represents the first socket 102 prior to installation of the chipset 106 into the cavity 110. As such, the antenna 614 is coupled to the first socket 102 in such a manner that allows a physical and/or communication connection between the antenna 614 and the chipset 106. In this implementation, the antenna 614 is located adjacently to the cavity 110. The installation of the chipset 106 into the cavity 110, provides the electrical connection between the antenna 614 and the installed chipset 106. The antenna 614 may be coupled to the first socket 102 by adhesive means and/or electro-plating mechanism.

FIG. 6D represents the first socket 102 after installation of the chipset 106 in the cavity 110. The cavity 110 as illustrated in FIG. 6C is located on the underside of the installed chipset 106. Unlike FIGS. 6A-6B, the antenna 614 is positioned around the cavity 110 of the first socket 102.

Figure 7:
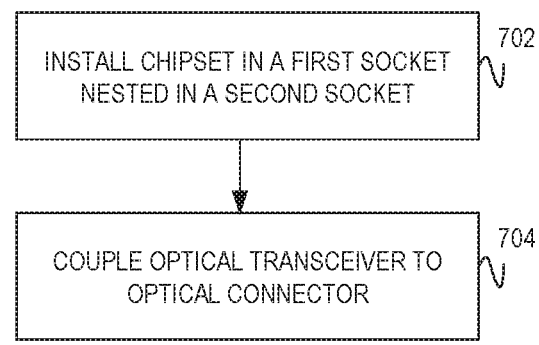
FIGS. 7-8 illustrate example flow diagrams in accordance with the present disclosure.
Figure 8:
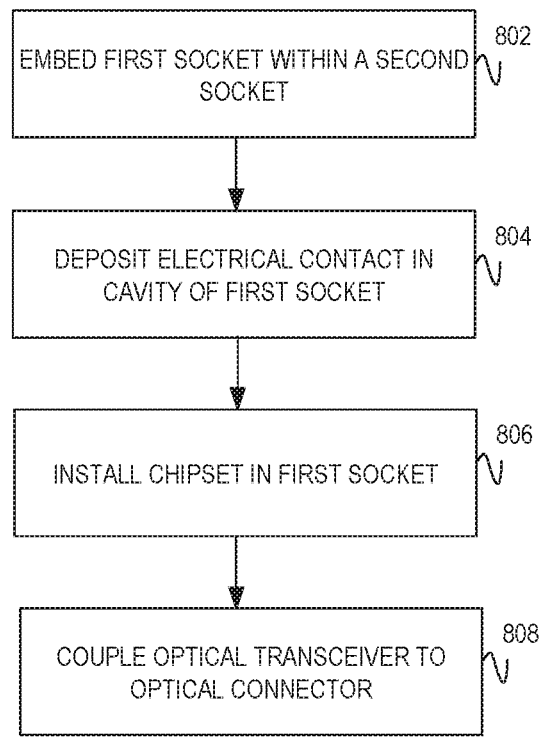

Referring now to FIGS. 7 and 8, flow diagrams are illustrated in accordance with various examples of the present disclosure. The flow diagrams represent processes that may be utilized in conjunction with various systems and devices as discussed with reference to the preceding figures. While illustrated in a particular order, the flow diagrams are not intended to be so limited. Rather, it is expressly contemplated that various processes may occur in different orders and/or simultaneously with other processes than those illustrated.

FIG. 7 is a flow diagram illustrating a method of manufacturing a first socket nested within a second socket. The method may begin and process at 702 where a chipset is installed in a first socket. In implementations, the chipset operates as a RFID device which transmits electromagnetic waves to other devices for detection and verification of an optical transceiver at 704.

Upon installing the chipset within the first socket, the optical transceiver is coupled to the optical connector at 704. The optical transceiver is affixed on a modular infrastructure on an underside of a multi-chip module. The optical connector may be modularly installed in the second socket. The second socket in turn is installed on a printed circuit board (PCB). The PCB includes the second socket with the nested first socket. The chipset detects when the optical transceivers are coupled to the optical connectors in the second socket. In this example, the optical transceiver is brought into closer proximity to the optical connector while the optical connector is supported by the second socket. As such, the chipset detects when the optical transceiver is brought within a particular proximity to the optical connector. In one implementation, the chipset operates as an RFID reader. In this example, a RFID tag is in an adjacent position to the optical transceivers. Thus, when the RFID tag is brought within the proximity of the RFID reader, the RFID tag verifies to the RFID reader whether the optical transceivers have the appropriate signal interface characteristics for coupling to the optical connectors.

FIG. 8 is a flow diagram illustrates an additional method of manufacturing a first socket nested within a second socket in accordance with the present disclosure. The method may begin and process at 802 where a first socket is embedded in a second socket. The first socket is in smaller dimension than the second socket, so the second socket may be created prior to the construction of the first socket. Constructing the first socket within the second socket includes depositing an electrical contact within a first socket cavity at 804.

At 804, the electrical contact is disposed within the first socket cavity. The electrical contact is an electrical medium for transmitting signals over. In this manner, when the chipset is installed in the first socket cavity at operation 806, the chipset may communicate using the electrical contact. The electrical contact within the first socket cavity is coupled to a printed circuit board (PCB) which supports the first and second socket.

At 806, the chipset is installed in the first socket cavity. The chipset is installed on top of the electrical contact within the first socket cavity. At 808, a multi-chip module supporting an optical transceiver is coupled above the second socket. The second socket includes an optical connector. The optical transceiver located on a modular infrastructure of a multi-chip module is coupled to the optical connector in the second socket in such a manner that form a connection. Upon forming the connection between the optical transceiver and optical connector, the chipset detects this connection using a radio frequency mechanism. Operations 806-808 may be similar in functionality to operations 702-704 as in FIG. 7.

Although certain embodiments have been illustrated and described herein, it will be greatly appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

We claim:

1. An apparatus comprising:
a first socket nested within a second socket, the first socket comprising:
a cavity, disposed in the first socket, to accept a chipset; and
an electrical contact, disposed in the cavity, to couple the chipset to a board,
wherein the chipset, based on data from connectors of the second socket, detects when a modular infrastructure is coupled to the connectors of the second socket and a type of modular infrastructure coupled to the second socket;
wherein the chipset sends the type of modular infrastructure to a controller.

2. The apparatus of claim 1 comprising:
an antenna, coupled to the cavity of the first socket, to detect when the modular infrastructure is coupled to the second socket.

3. The apparatus of claim 1 comprising:
an antenna, coupled to the chipset, to detect when the modular infrastructure is coupled to the second socket.

4. The apparatus of claim 1 comprising:
the second socket comprising a different cavity to accept the first socket, wherein the different cavity is elevated above the cavity.

5. The apparatus of claim 1 wherein the chipset includes a near-field communication (NFC) reader and the modular infrastructure is associated with a near-field communication (NFC) tag.

6. A system comprising:
a multi-chip module comprising:
radio-frequency identification (RFID) tags; and
a board comprising:
a first socket, nested within a second socket, to accept a RFID device, wherein the RFID device detects when the multi-chip module is coupled to the second socket based on a reading of one of the RFID tags and wherein the RFID device detects characteristics of the multi-chip module based on other RFID tags attached to connectors of the second socket.

7. The system of claim 6 wherein the multi-chip module comprises:
an optical transceiver, coupled to the RFID tag, to couple to an optical connector disposed within the second socket.

8. The system of claim 6 wherein the board comprises:
an optical connector, coupled to the second socket, to couple an optical transceiver disposed on the multi-chip module, wherein each optical connector includes an additional RFID tag; and
the second socket, disposed on the board, to support the first socket.

9. The system of claim 6 wherein the board comprises:
an antenna coupled to the first socket.

10. The system of claim 6 wherein the board comprises:
an antenna coupled to the RFID device.

11. The system of claim 6 wherein the board comprises:
the RFID device, disposed in the first socket, upon detection of when the multi-chip module is coupled to the second socket to communicate the coupling to a controller for verification of the coupling.

12. A method comprising:
installing a chipset in a first socket nested within a second socket; and coupling an optical transceiver disposed on a multi-chip module to an optical connector supported by the second socket, wherein the chipset detects, based on data from the optical connector, when the optical transceiver is coupled to the optical connector and a type of optical transceiver coupled to the optical connector.

13. The method of claim 12 comprising:
embedding the first socket within the second socket to provide the first socket nested within the second socket.

14. The method of claim 12 comprising:
depositing an electrical contact in a cavity disposed in the first socket, wherein the cavity disposed in the first socket is lower in elevation than a cavity of the second socket.

* * * * *